US012604450B2

(12) United States Patent (10) Patent No.: US 12,604,450 B2
Nakagawa et al. (45) Date of Patent: Apr. 14, 2026

(54) CASE

(71) Applicant: Murata Manufacturing Co., Ltd.,
Nagaokakyo (JP)

(72) Inventors: Kiyoyuki Nakagawa, Nagaokakyo (JP);
Yasuhiro Shimizu, Nagaokakyo (JP)

(73) Assignee: MURATA MANUFACTURING CO.,
LTD., Kyoto (JP)

( * ) Notice: Subject to any disclaimer, the term of this
patent is extended or adjusted under 35
U.S.C. 154(b) by 354 days.

(21) Appl. No.: 18/231,858

(22) Filed: Aug. 9, 2023

(65) Prior Publication Data

US 2023/0389247 A1 Nov. 30, 2023

Related U.S. Application Data

(63) Continuation of application No.
PCT/JP2022/007012, filed on Feb. 21, 2022.

(30) Foreign Application Priority Data

Feb. 26, 2021 (JP) ................................. 2021-030244

(51) Int. Cl.
*H05K 13/00* (2006.01)
*H05K 13/02* (2006.01)
(52) U.S. Cl.
CPC ......... *H05K 13/0084* (2013.01); *H05K 13/00*
(2013.01); *H05K 13/028* (2013.01)
(58) Field of Classification Search
CPC ........ B65D 85/86; B65D 85/38; H05K 13/02;
H05K 13/0084; H01G 13/00; H01F 21/00
(Continued)

(56) References Cited

U.S. PATENT DOCUMENTS 5,368,193 A * 11/1994 Takahashi .......... H05K 13/0084
221/278
5,853,079 A * 12/1998 Ito ........................ H05K 13/028
198/395

(Continued)

FOREIGN PATENT DOCUMENTS

JP 0228490 U1 2/1990
JP 0890353 A 4/1996

(Continued)

OTHER PUBLICATIONS

International Search Report in PCT/JP2022/007012, mailed May
10, 2022, 3 pages.

(Continued)

*Primary Examiner* — Rakesh Kumar
(74) *Attorney, Agent, or Firm* — Keating & Bennett, LLP

(57) ABSTRACT

A case includes a guide portion to guide sliding of a shutter
to open and close a discharge port of a case body, a main
pathway at which an end of the shutter is located when the
shutter is in a state to open the discharge port, and first and
second branching pathways into which the end of the shutter
can be selectively inserted when the shutter is in a state to
close the discharge port. When a pin is fitted into the case
body, the end of the shutter is inserted into the first branching
pathway, and when the pin is not fitted, the end is inserted
into the second branching pathway, so that it is apparent
from the exterior that the distal end is inserted into the first
or second branching pathway.

17 Claims, 9 Drawing Sheets

(58) Field of Classification Search
USPC ......................................................... 221/303
See application file for complete search history.

(56)                     References Cited

U.S. PATENT DOCUMENTS

| | | | | |
|---|---|---|---|---|
| 6,041,964 | A | 3/2000 | Tokarz et al. | |
| 9,963,303 | B2 * | 5/2018 | Mizuno ................. | B65G 47/90 |
| 2024/0064948 | A1 * | 2/2024 | Kato .................. | H05K 13/0417 |
| 2024/0206140 | A1 * | 6/2024 | Nakagawa .......... | H05K 13/043 |

FOREIGN PATENT DOCUMENTS

| | | | | | |
|---|---|---|---|---|---|
| JP | 08090353 | A | * | 4/1996 | ......... H05K 13/0084 |
| JP | 08274496 | A | | 10/1996 | |
| JP | 08336730 | A | * | 12/1996 | ............. B23P 19/00 |
| JP | 09283987 | A | * | 10/1997 | ............. H05K 13/02 |
| JP | 2002274593 | A | * | 9/2002 | ............. B65D 85/86 |
| JP | 3624844 | B2 | * | 3/2005 | ............. B65D 85/86 |
| JP | 2009295618 | A | | 12/2009 | |
| JP | 5853079 | B2 | * | 2/2016 | ............. A63F 7/02 |
| JP | 2022140220 | A | * | 9/2022 | ............. B23P 19/00 |
| WO | WO-2022181555 | A1 | * | 9/2022 | ........... H05K 13/029 |
| WO | WO-2022181556 | A1 | * | 9/2022 | ........... H05K 13/028 |
| WO | WO-2023135877 | A1 | * | 7/2023 | ............. H05K 5/065 |
| WO | WO-2025013868 | A1 | * | 1/2025 | ............. H01G 13/00 |

OTHER PUBLICATIONS

Written Opinion in PCT/JP2022/007012, mailed May 10, 2022, 3 pages.

* cited by examiner

CASE

CROSS REFERENCE TO RELATED APPLICATIONS

This application claims the benefit of priority to Japanese Patent Application No. 2021-030244 filed on Feb. 26, 2021 and is a Continuation Application of PCT Application No. PCT/JP2022/007012 filed on Feb. 21, 2022. The entire contents of each application are hereby incorporated herein by reference.

BACKGROUND OF THE INVENTION

1. Field of the Invention

The present invention relates to a case to house electronic components such as chip components.

2. Description of the Related Art

When mounting electronic components on a board, a mounting device is used which mounts each of the electronic components at a predetermined position on the board.

It is necessary to supply electronic components individually to such a mounting device.

For example, Japanese Unexamined Patent Application, Publication No. 2009-295618 discloses a case in which electronic components in a loose state are collectively housed, and the electronic components drop onto a feeder by their own weight from a take-out port at a bottom portion.

The electronic components are individually supplied to the mounting device by the feeder.

In the case disclosed in Japanese Unexamined Patent Application, Publication No. 2009-295618, if different types of electronic components are mixed, the types of electronic components to be mounted are different, and therefore, it is necessary to avoid mixing.

Different types of electronic components are mixed from the discharge port of the opened case.

Therefore, it is desirable to be able to determine whether or not the case has been opened.

This is because, if it is determined that the case is opened, it can be determined that there is a possibility that different types of electronic components may be mixed in the case.

SUMMARY OF THE INVENTION

Preferred embodiments of the present invention provide cases in each of which it is possible to determine whether or not the case has been opened.

A case according to a preferred embodiment of the present invention includes a case body to house a plurality of components and including a discharge port to discharge housed components, a shutter to open and close the discharge port by sliding, and a guide portion in the case body to guide the sliding of the shutter, wherein the guide portion includes a main path in which one end portion of the shutter is provided when the shutter opens the discharge port, and a first branch path and a second branch path that each branch from an end portion of the main path and to each of which the one end portion of the shutter is selectively insertable when the shutter closes the discharge port, a regulator is detachably attached to the case body such that the one end portion of the shutter is selectively inserted to either one of the first branch path and the second branch path, in which, in a case in which the shutter slides to close the discharge port from a state in which the discharge port is open, while the regulator is attached to the case body, the one end portion of the shutter is inserted into the first branch path, and while the regulator is not attached to the case body, the one end portion of the shutter is inserted into the second branch path, and it can be visually recognized from outside that the one end portion of the shutter is inserted into either one of the first branch path and the second branch path.

According to preferred embodiments of the present invention, cases are provided in each of which it is possible to determine whether or not the case has been opened.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

Figure 1:
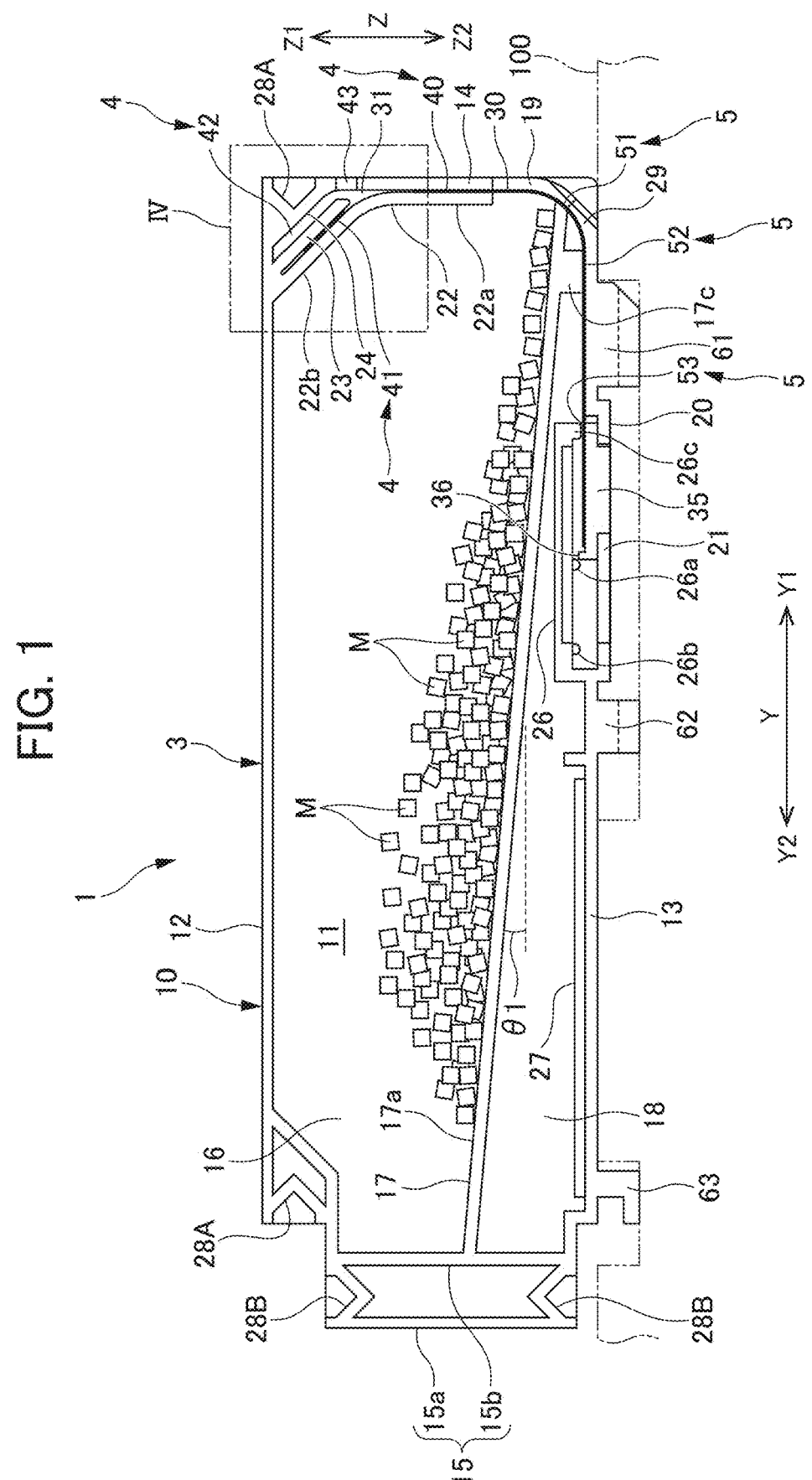
FIG. 1 is a side view showing an interior of a case set to a feeder according to a preferred embodiment of the present invention.
Figure 2:
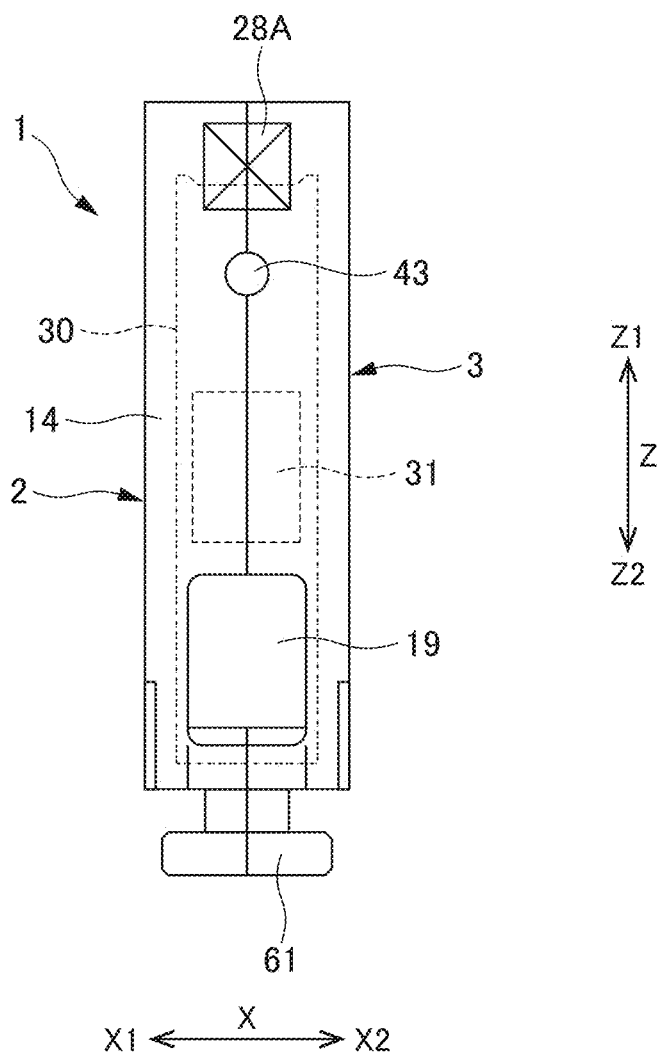
FIG. 2 is a front view of a case according to a preferred embodiment of the present invention.
Figure 3:
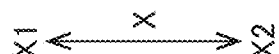
FIG. 3 is a bottom view of a case according to a preferred embodiment of the present invention.
Figure 3:
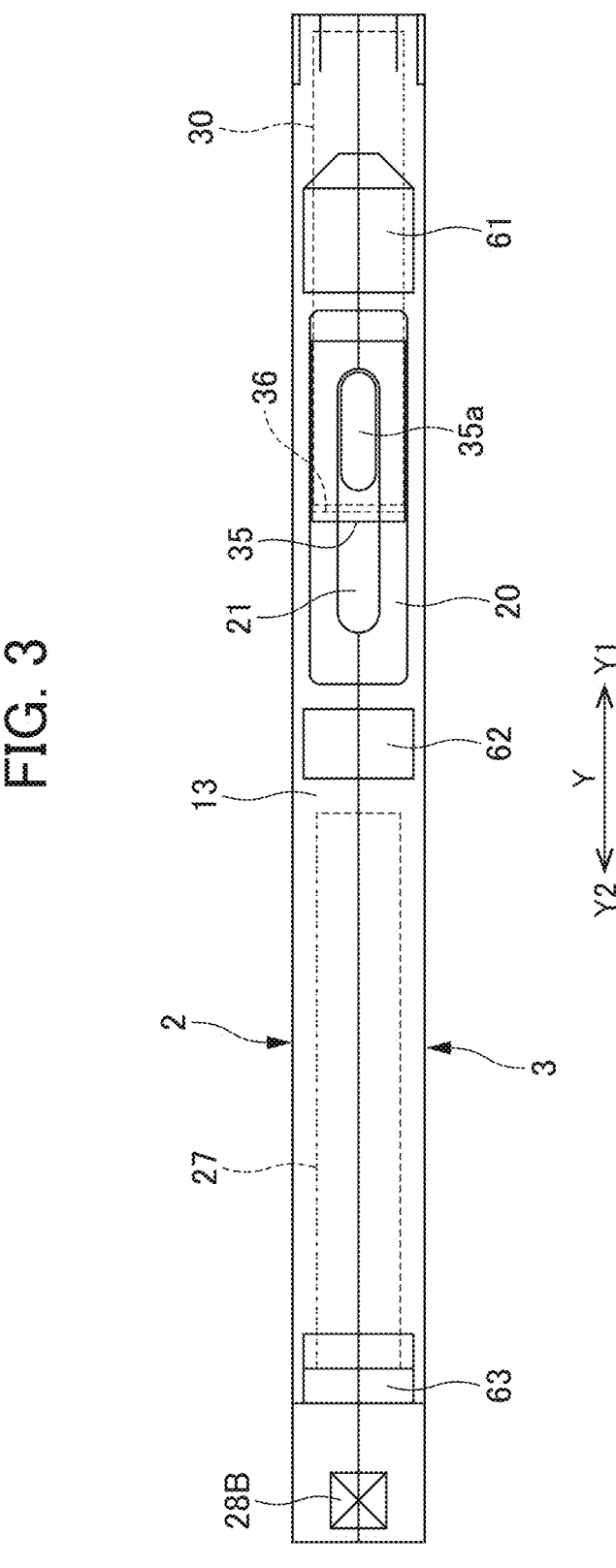

FIG. 1 is a side view of an interior of a case 1 according to a preferred embodiment of the present invention. FIG. 2 is a front view of the case 1 viewed from the front. FIG. 3 is a bottom view of the case 1.

As shown in FIG. 1, the case 1 houses therein a plurality of electronic components M (shown in FIG. 1) as components in a loose state.

The case 1 housing a plurality of electronic components M is detachably set in a feeder 100, for example.

The feeder 100 discharges the electronic components M from the case 1 using vibration, and supplies the electronic components M to a mounting device (not shown).

Each of the electronic components M of the present preferred embodiment is, for example, a small rectangular or substantially rectangular parallelepiped electronic component having a length of about 1.2 mm or less in the longitudinal direction.

Examples of such electronic components include capacitors and inductors. However, the present preferred embodiment is not limited thereto.

Arrows X, Y, and Z shown in any one of FIGS. 1, 2, and 3 respectively indicate the lateral (left-right) direction, the longitudinal (front-rear) direction, and the vertical (up-down) direction of the case 1 when the case 1 is set in the feeder 100.

Furthermore, the left side in the lateral direction X is denoted by X1, the right side is denoted by X2, the front side in the longitudinal direction Y is denoted by Y1, the rear side is denoted by Y2, the upper side in the vertical direction Z is denoted by Z1, and the lower side is denoted by Z2.

Also in FIGS. 4 to 9, the lateral direction X, the longitudinal direction Y, and the vertical direction Z are similarly applied.

The lateral direction, the longitudinal direction, and the vertical direction in the following description are based on the directions indicated by the arrows.

As shown in FIGS. 2 and 3, the case 1 includes a first member 2 and a second member 3 that are provided symmetrically in the lateral direction and joined together.

That is, the first member 2 and the second member 3 are half-split members which are divided into left and right members.

The first member 2 and the second member 3 are each a molded body made of a transparent or semitransparent resin material having hardness to sufficiently protect the electronic components M.

FIG. 1 shows a state in which there is no first member 2 on the left side, and shows the interior of the second member 3 on the right side.

The case 1 has a flat box shape that is long in the longitudinal direction and thin in the lateral direction.

In the following description, except where necessary, the first member 2 and the second member 3 are not individually described, and the configuration in which the first member 2 and the second member 3 are joined to each other will be described.

As shown in FIG. 1, the case 1 includes a case body 10 that houses the plurality of electronic components M, and a shutter 30 that opens and closes a discharge port 19 of the case body 10.

The case body 10 includes a housing space 11 to house the plurality of electronic components M in a loose state.

The case body 10 includes a top plate portion 12 and a bottom plate portion 13 which extend in the longitudinal direction, a front wall portion 14 and a rear wall portion 15 which extend in the vertical direction, a pair of left and right side wall portions 16, and an sloped plate portion 17 which partitions the interior of the case body 10 vertically.

The rear wall portion 15 includes an outer rear wall portion 15a defining and functioning as an outer surface and an inner rear wall portion 15b in front of the outer rear wall portion.

The discharge port 19 is provided at the lower portion of the front wall portion 14.

As shown in FIG. 2, the discharge port 19 is a rectangular or substantially rectangular opening.

The discharge port 19 is not limited to a rectangular or substantially rectangular shape, and may be, for example, an opening having a circular or substantially circular shape, an elliptical or substantially elliptical shape, or the like.

The discharge port 19 is opened and closed by a shutter 30 described later.

The sloped plate portion 17 extends between the left and right side wall portions 16 and extends from the inner rear wall portion 15b to the lower portion of the discharge port 19.

The sloped plate portion 17 is provided below the interior of the center of the case body 10 in the vertical direction.

In the case body 10, the upper side of the sloped plate portion 17 defines and functions as the housing space 11, and the lower side of the sloped plate portion 17 defines and functions as a lower space 18.

The sloped plate portion 17 is sloped at a downward gradient toward the discharge port 19, and an upper surface of the sloped plate portion 17 is a sloped surface 17a which is sloped at a downward gradient toward the discharge port 19.

In the present preferred embodiment, the slope angle $\theta 1$ of the sloped surface 17a is, for example, about 10° with respect to the horizontal direction when the case 1 is set to the feeder 100.

The slope angle $\theta 1$ of the sloped surface 17a is, for example, preferably about 3° or more and about 10° or less.

The shutter 30 slides to open and close the discharge port 19.

The shutter 30 continuously extends from the bottom plate portion 13 to the front wall portion 14, and is slidable along the extending direction.

The shutter 30 is an elongated strip-shaped film.

The shutter 30 is made of a bendable and flexible material having a certain degree of rigidity such as, for example, PET (polyethylene terephthalate).

The width of the shutter 30 is slightly larger than the width of the discharge port 19, and has a width capable of covering the discharge port 19 without any gap.

As shown in FIGS. 1 and 2, an opening 31 having the same or substantially the same shape as the discharge port 19 is provided in the front end portion of the shutter 30.

The shutter 30 can slide along the lower guide portion and the upper guide portion 4 of the case body 10.

The lower guide portion 5 is provided above the bottom plate portion 13, and the upper guide portion 4 is provided above the discharge port 19.

Figure 4:
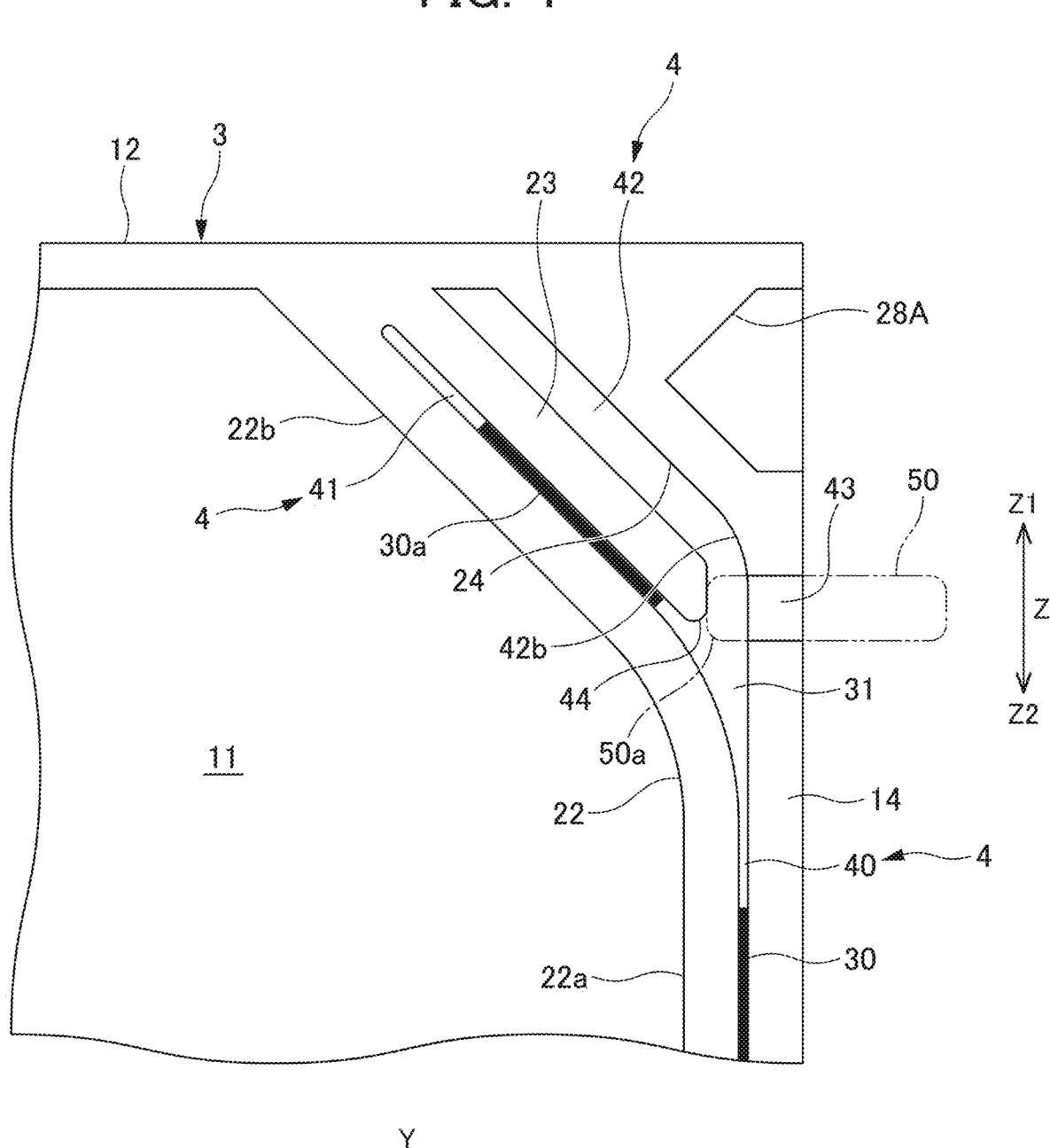
FIG. 4 is an enlarged view of a portion indicated by IV in FIG. 1.

The upper guide portion 4 shown in detail in FIG. 4 is an example of the guide portion.

When the case 1 is set to the feeder 100, the rear side of the shutter 30 slides horizontally or substantially horizontally along the lower guide portion 5, and the front side of the shutter 30 slides vertically or substantially vertically along the upper guide portion 4.

Each of the lower guide portion 5 and the upper guide portion 4 provides a passage to slidably hold the shutter 30 while maintaining the surface direction of the shutter 30 along the lateral direction.

Figure 5:
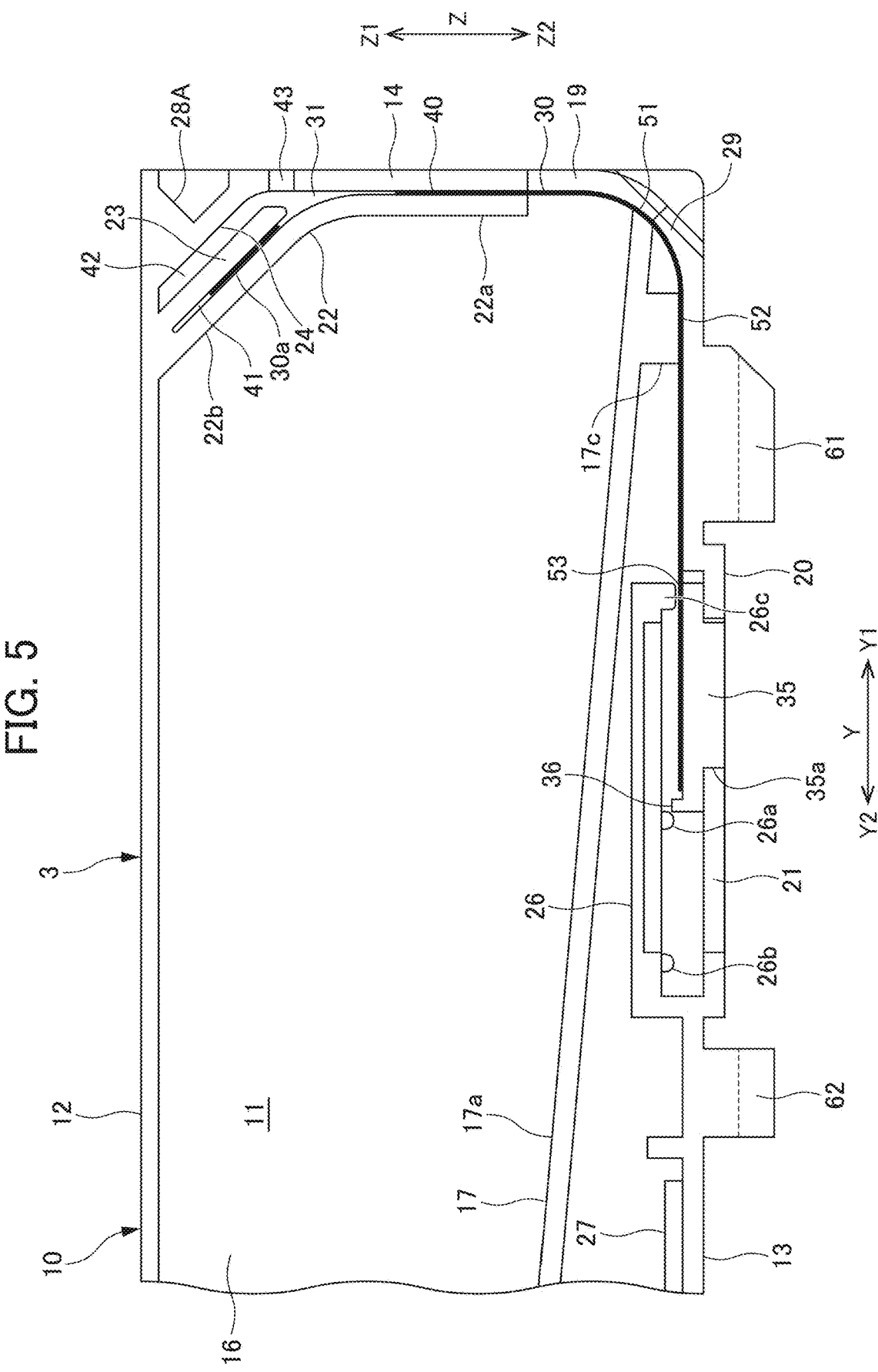
FIG. 5 is a side view of a portion including an end portion of a discharge port in a case according to a preferred embodiment, showing a state in which the discharge port is closed by a shutter and a distal end portion of the shutter is inserted into a first path of a guide portion.

As shown in FIGS. 1 and 5, a slider 35, which is a plate piece to slide the shutter 30 to open and close the discharge port 19, is provided at the rear end of the shutter 30.

The slider 35 is integrally fixed to the lower surface of the shutter 30.

As shown in FIG. 3, the slider 35 includes a knob 35a protruding downward.

The knob 35a includes an elliptical or substantially elliptical protrusion elongated in the longitudinal direction.

The bottom plate portion 13 is provided with an elongated hole 21 to accommodate the knob 35*a* of the slider 35 and enable the slider 35 to move in the longitudinal direction.

In the range in which the shutter 30 slides, when the opening 31 coincides with the discharge port 19, the discharge port 19 opens, and when the opening 31 is provided above the discharge port 19, the discharge port 19 is closed by the shutter 30.

The slider 35 includes a stopper 36 to position the slide position of the shutter 30 at two positions, i.e., a position where the opening 31 of the shutter 30 coincides with the discharge port 19, and a position where the opening 31 moves above the discharge port 19 and the shutter 30 closes the discharge port 19.

As shown in FIG. 5, the stopper 36 includes a protruding portion which is provided at the rear end portion on the upper surface of the slider 35 and protrudes upward.

As shown in FIG. 1, a plate portion 26 is provided in the lower space 18 such that a space in which the slider 35 is arranged is provided between the bottom plate portion 13 and the plate portion 26.

The plate portion 26 is provided integrally with the bottom plate portion 13.

A front protruding portion 26*a* and a rear protruding portion 26*b* each protruding downward are provided in a pair in the longitudinal direction at a rear end portion on the lower surface of the plate portion 26.

A guide protrusion 26*c* of a first lower guide portion 51 described later is provided at a front end portion on the lower surface of the plate portion 26.

The stopper 36 engages with one of the front protruding portion 26*a* and the rear protruding portion 26*b*.

When the slider 35 moves forward and the stopper 36 engages with the front protruding portion 26*a*, the opening 31 is positioned at the front wall portion 14 above the discharge port 19, and the discharge port 19 is closed by the shutter 30, as shown in FIGS. 2 and 5.

Figure 6:
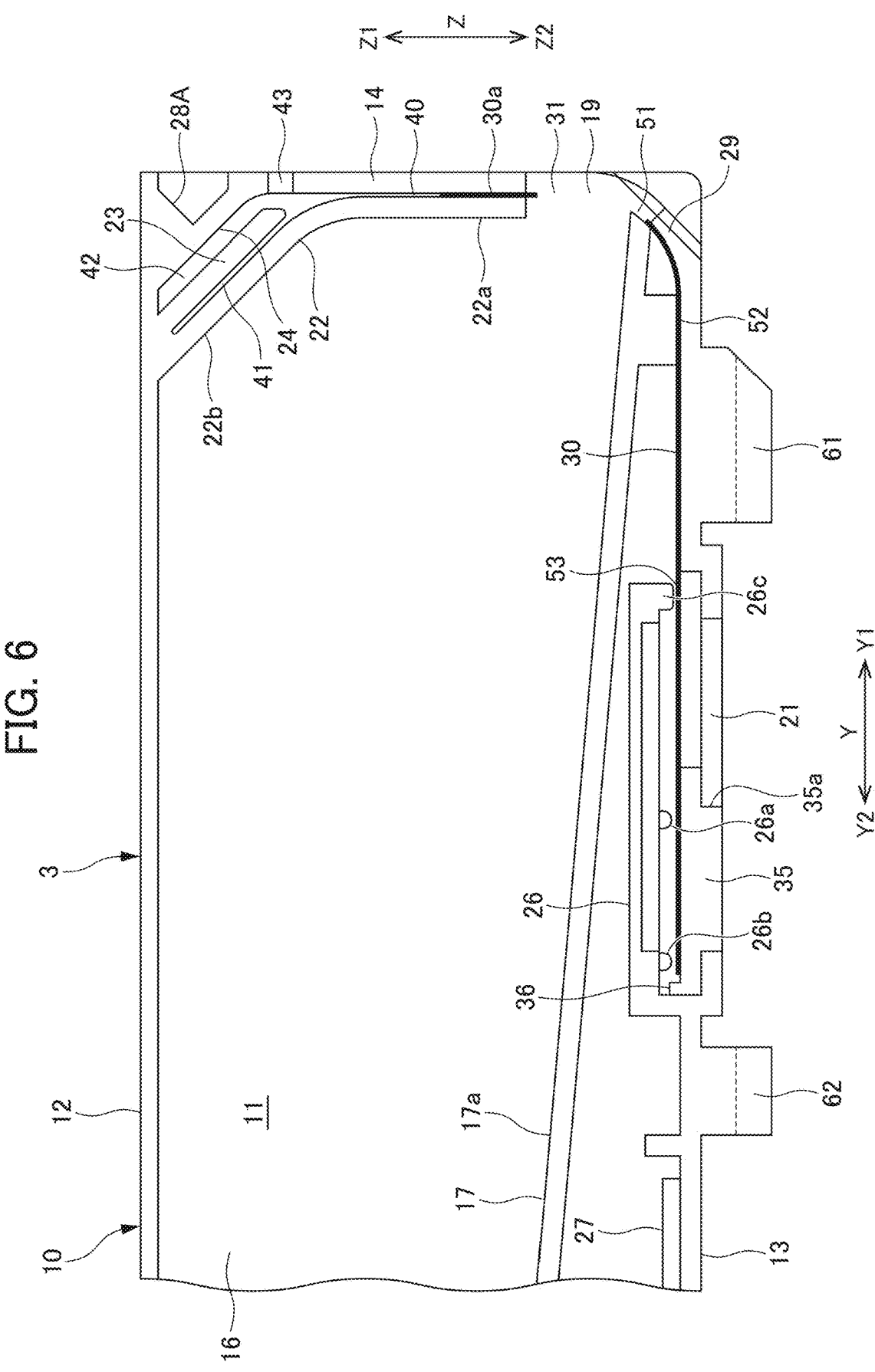
FIG. 6 is a side view of a portion including an end portion of a discharge port in a case according to a preferred embodiment of the present invention, showing a state in which the discharge port is open.

When the slider 35 moves rearward and the stopper 36 engages with the rear protruding portion 26*b*, the opening 31 coincides with the discharge port 19, and the discharge port 19 is opened as shown in FIG. 6.

The electronic components M housed in the housing space 11 pass through the open discharge port 19 and are discharged from the case 1.

The slider 35 may be manually slid, or may be driven using a device such as an actuator, for example.

As shown in FIGS. 1 and 5, the lower guide portion 5 includes a first lower guide portion 51 provided below the discharge port 19, a second lower guide portion 52 provided behind the first lower guide portion 51, and a third lower guide portion 53 provided behind the second lower guide portion 52.

The third lower guide portion 53 includes the guide protrusion 26*c* provided at the front end portion on the lower surface of the plate portion 26.

The second lower guide portion 52 includes a slit provided between a protruding portion 17*c* that protrudes downward at the front end portion of the sloped plate portion 17 and the bottom plate portion 13.

The first lower guide portion 51 includes a front end surface of the sloped plate portion 17 and a front end portion 29 of the bottom plate portion 13.

The shutter 30 slides on the lower surface of the guide protrusion 26*c* in the third lower guide portion 53 and passes through the slit provided between the protruding portion 17*c* and the bottom plate portion 13 in the second lower guide portion 52.

With such a configuration, the rear side of the shutter 30 slides in the longitudinal direction immediately above the bottom plate portion 13.

In the first lower guide portion 51, the shutter 30 slides along the front end portion 29 of the bottom plate portion 13 which curves concavely in the longitudinal direction, and further slides along the front end surface of the sloped plate portion 17, such that the shutter 30 bends upward at an angle of approximately 90° from the horizontal direction, and switches over to a posture extending in the vertical direction.

The shutter 30 slides in the vertical direction above the third lower guide portion 53.

As shown in FIGS. 1 and 5, the upper guide portion 4 includes a main path 40 extending in the vertical direction, and a first branch path 41 and a second branch path 42 that are branched from the upper end of the main path 40 into two paths in the longitudinal direction.

An inner front wall portion 22 extending downward from the top plate portion 12 is provided at a front end portion inside the case body 10.

The inner front wall portion 22 includes a sloped portion 22*b* which extends forward from the top plate portion 12 downward, and a hanging portion 22*a* which hangs down from the lower end of the sloped portion 22*b* along the front wall portion 14.

The main path 40 is a slit extending in the vertical direction between the hanging portion 22*a* and the front wall portion 14.

As shown in FIG. 4, a sloped inner surface 24 opposed to the sloped portion 22*b* of the inner front wall portion 22 in parallel or substantially in parallel is provided on the upper portion of the front wall portion 14.

A branch wall portion 23 is provided between the sloped inner surface 24 and the sloped portion 22*b* of the inner front wall portion 22.

The branch wall portion 23 is provided integrally with the top plate portion 12, and extends parallel or substantially parallel to the sloped inner surface 24 and the sloped portion 22*b*.

The first branch path 41 is a slit provided between the sloped portion 22*b* of the inner front wall portion 22 and the branch wall portion 23.

The second branch path 42 is a slit provided between the sloped inner surface 24 and the branch wall portion 23.

The first branch path 41 and the second branch path 42 are parallel or substantially parallel to each other, branch from the upper end of the main path 40 to both sides of the branch wall portion 23, respectively, and are sloped so as to extend rearward toward the upper side.

As shown in FIG. 6, in a state where the opening 31 of the shutter 30 coincides with the discharge port 19 of the case body 10 and the discharge port 19 is opened, one end portion closer to the front end than the opening 31 of the shutter 30, i.e., the distal end portion 30*a*, is provided in the main path 40.

When the shutter 30 further slides forward from this position and the distal end portion 30*a* slides upward, the distal end portion 30*a* is selectively inserted into one of the first branch path 41 and the second branch path 42.

When the distal end portion 30*a* is inserted into one of the first branch path 41 and the second branch path 42, the opening 31 is provided between the front wall portion 14 and the inner front wall portion 22, and the discharge port 19 is closed by the shutter 30.

As described above, since the first member 2 and the second member 3 of the case 1 are transparent or semi-transparent, it can be visually recognized from the outside that the distal end portion 30*a* of the shutter 30 is inserted into one of the first branch path 41 and the second branch path 42.

In the present preferred embodiment, the distal end portion 30*a* of the shutter 30 is regulated so as to be selectively inserted into one of the first branch path 41 and the second branch path 42 by a pin 50 defining and functioning as a regulator which is detachably attached to the front wall portion 14.

As shown in FIG. 4, the pin 50 is detachably fitted into a through hole 43 provided in the front wall portion 14 and extending in the longitudinal direction.

The through hole 43 is provided in front of a wall tip 44 of the branch wall portion 23.

A pin tip 50*a* of the pin 50 fitted into the through hole 43 is brought into contact with the wall tip 44 of the branch wall portion 23 to close the entrance of the second branch path 42.

In this state, when the shutter 30 slides forward and the distal end portion 30*a* moves upward, the distal end portion 30*a* is brought into contact with the pin tip 50*a* of the pin 50 and the wall tip 44 of the branch wall portion 23, and thus bent toward the first branch path 41 to be inserted into the first branch path 41.

Figure 7:
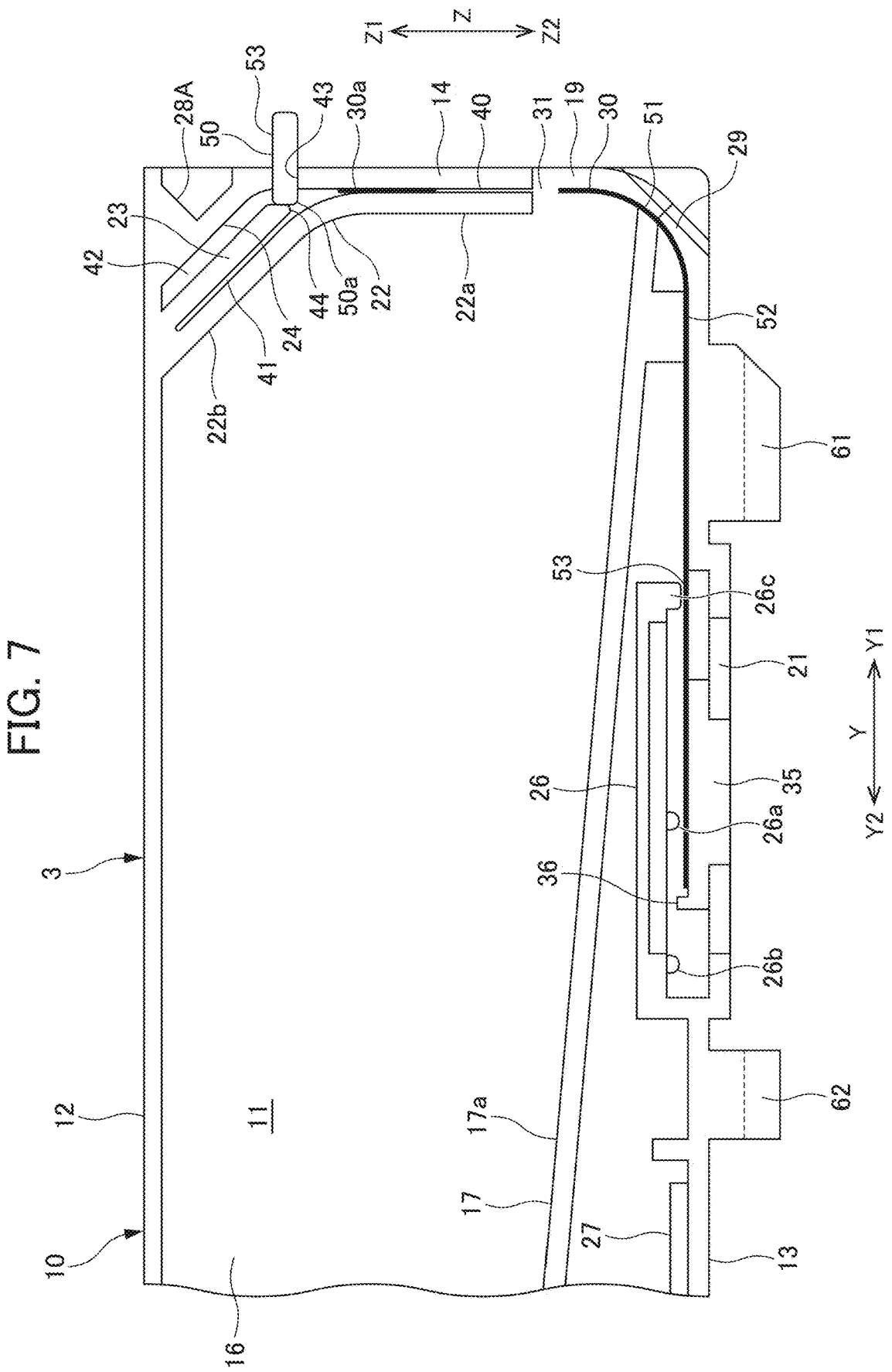
FIG. 7 is a view showing a state in which a distal end portion of a shutter, to which a pin is attached and which is slid in a closing direction, is provided in front of a first path and a second path of the guide portion from the state shown in FIG. 6.
Figure 8:
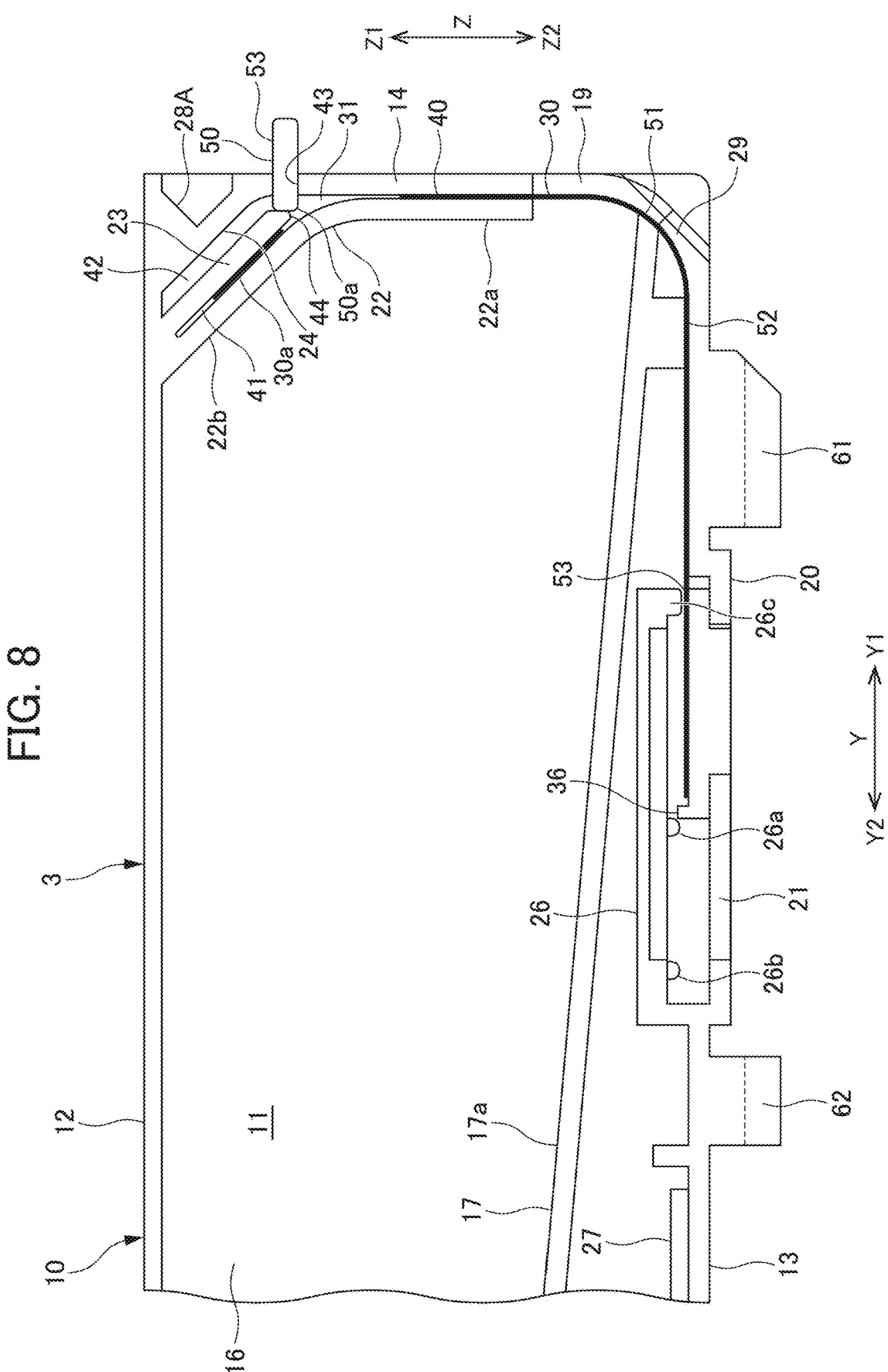
FIG. 8 is a view showing a state in which the distal end portion of the shutter is inserted into the first path of the guide portion by sliding the shutter in the closing direction from the state shown in FIG. 7.

FIGS. 7 to 8 show a non-limiting example of a process.

Figure 9:
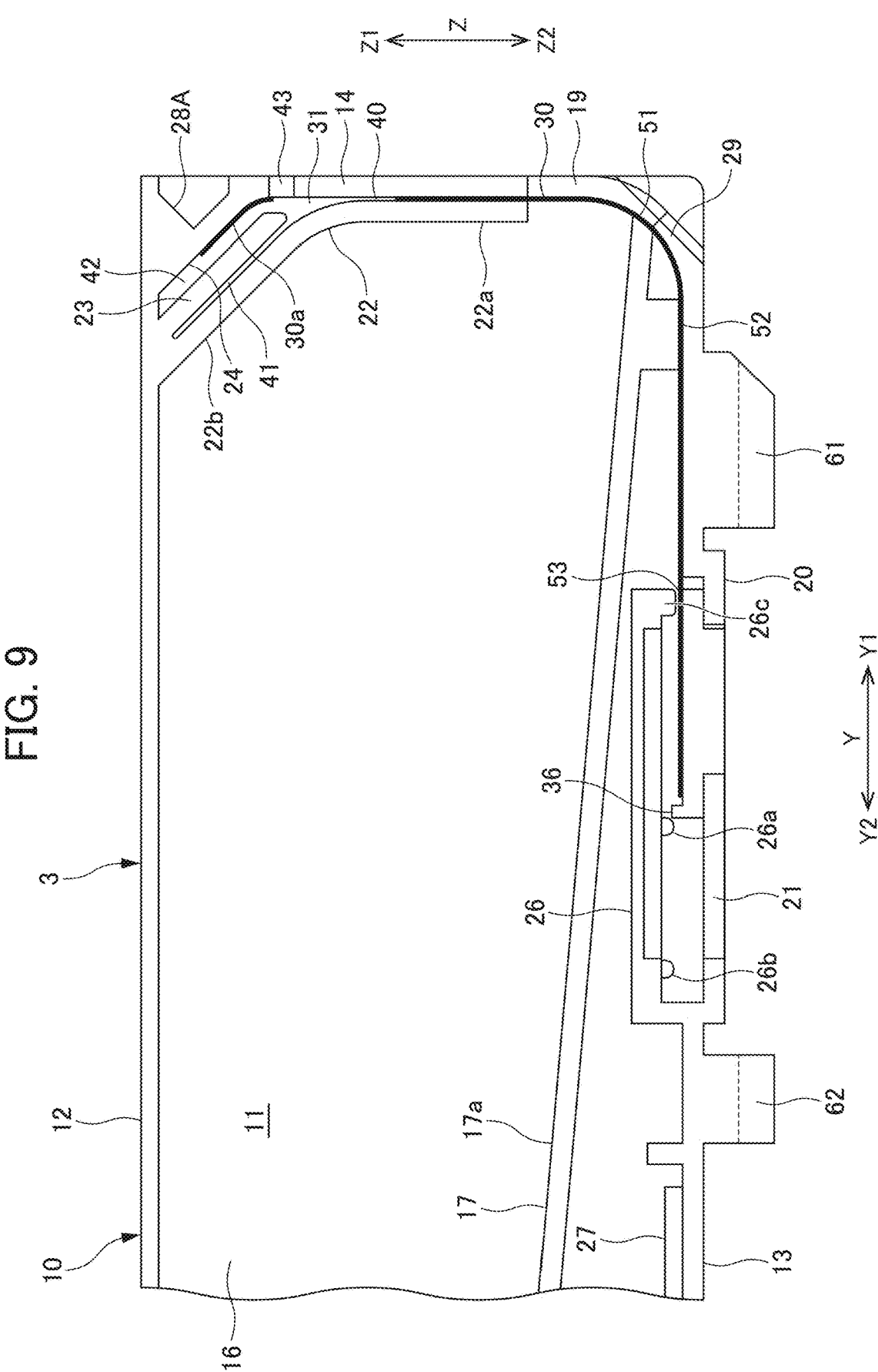
FIG. 9 is a view showing a state in which the distal end portion of the shutter is inserted into the second path of the guide portion by sliding the shutter in the closing direction in a state in which the pin is not attached from the state shown in FIG. 6.

On the other hand, in a state in which the pin 50 is not attached to the through hole 43, the distal end portion 30*a* of the shutter 30 is inserted into the second branch path 42 as shown in FIG. 9, while maintaining a straight configuration due to its rigidity.

The distal end portion 30*a* of the shutter 30 slides while bending along the front curved surface 42*b* and the sloped inner surface 24 provided at the entrance of the second branch path 42, and is inserted into the second branch path 42.

Although the pin 50 is a short rod-shaped member detachably fitted to the through hole 43, for example, a special pin or a special screw to be attached to the case body 10 using a special tool may be used instead of the pin 50.

The term "special pin" or "special screw" as used herein does not refer to a tool which is widely used and which can be attached and detached, but refers to a tool which is not able to be attached and detached unless a special tool is engaged with a hole having a special shape or unevenness.

As shown in FIG. 1, the band-shaped RFID tag 27 elongated in the longitudinal direction is provided at a rear portion of the lower space 18.

The RFID tag 27 is configured in, for example, a shielded state and is attached to the upper surface of the bottom plate portion 13.

The RFID tag 27 has a publicly known configuration including a transmission/reception unit, memory, an antenna, and the like.

A reader/writer (not shown) to read and write information from and to the RFID tag 27 is provided in the feeder 100.

The case body 10 includes upper grip portions 28A and rear grip portions 28B.

The upper grip portions 28A are a pair of front and rear depressions provided at both front and rear ends of the upper side of the case body 10.

The rear grip portions 28B are a pair of upper and lower depressions provided at both upper and lower ends of the rear side of the case body 10.

Each of the upper grip portions 28A and the rear grip portions 28B is gripped by the robot hand, for example, when the case 1 is transported by the robot hand.

As shown in FIG. 1, the case 1 includes a plurality of claw portions on the bottom surface to detachably set the case 1 in the feeder 100.

In the present preferred embodiment, a first claw portion 61, a second claw portion 62, and a third claw portion 63 are provided on the bottom surface at intervals in the longitudinal direction.

The first claw portion 61, the second claw portion 62, and the third claw portion 63 engage with an engagement groove or the like appropriately provided on the feeder 100, and the case 1 is set to the feeder 100.

The third claw portion 63 may be locked by a lock mechanism (not shown) provided on the feeder 100 to fix the case 1 to the feeder 100.

The feeder 100 vibrates the case 1 as described above.

Vibration is applied to the feeder 100 by a vibrator (not shown).

Examples of the vibrator include, for example, a triaxial vibrator which applies three-dimensional vibrations in the longitudinal direction and the vertical direction to the feeder 100.

Due to the vibration, the electronic components M move down the sloped surface 17*a* and are discharged from the discharge port 19.

The case 1 having the above configuration is used, for example, as follows.

In a production factory of the electronic components M, a predetermined number of the produced electronic components M is put into the housing space 11 from the discharge port 19, and as shown in FIG. 5, the discharge port 19 is closed by the shutter and the electronic components M are stored in the case 1.

The case 1 housing the electronic components M is shipped to a manufacturer of assembled products where the electronic components M are mounted.

At the manufacturer of assembled products who received the case 1, the case 1 is set to the feeder 100, and the electronic components M are supplied to the mounting device in a state where the discharge port 19 is opened as shown in FIG. 6.

Here, the manufacturer of assembled products operates the slider 35 to open and close the discharge port 19 by the shutter 30 with a predetermined device.

When the discharge port 19 is closed by such a device, the pin 50 is always attached.

Therefore, when the shutter 30 is closed in the case 1 introduced in the mounting step, the distal end portion 30*a* of the shutter 30 is normally inserted into the first branch path 41, and the state is visually recognized.

The operation of closing the shutter 30 is not limited to the case where all of the electronic components M are mounted and the case 1 becomes empty, and the shutter 30 may be closed once for the case 1 where all of the electronic components M in the case 1 are not mounted and some electronic components M remain.

Also in this case, the shutter 30 is closed by the device from the state in which the pin 50 is mounted.

In a case where the operation is performed such that the opening and closing of the shutter 30 is performed only by the device, when it is visually recognized that the distal end portion of the shutter 30 is inserted into the second branch path 42, it is determined that the case 1 may be opened by the user operating the shutter 30, and then the shutter 30 may be closed.

In this case, the shutter 30 may be simply opened and closed by a person. However, it is also assumed that, for example, different kinds of electronic components are erroneously inserted into the case 1.

Alternatively, it may be assumed that a malicious person intentionally inserts another kind of component into the case 1.

Therefore, when it is visually recognized that the distal end portion 30a of the shutter 30 is inserted into the second branch path 42, it is determined that there is a possibility that the case 1 has been opened.

Thereafter, for example, by stopping the use of the case 1 and performing appropriate measures such as checking the contents in the case 1, it is possible to prevent the occurrence of a defect.

When the special pin or the special screw described above is attached instead of the pin 50 to guide the distal end portion 30a of the shutter 30 to the first branch path 41, it is difficult to remove the special pin or the special screw without using a special tool suitable for the special pin or the special screw.

Therefore, it is possible to restrict a person other than the permitted person from sliding the shutter 30 to open the case 1, and thus, it is possible to prevent mixing of components into the case 1.

With a case 1 according to a preferred embodiment described above, the following advantageous effects are achieved.

(1) A case 1 according to a preferred embodiment described above is directed to a case including the case body 10 that houses the plurality of electronic components M and includes the discharge port 19 that discharges the housed electronic components M, the shutter 30 that opens and closes the discharge port 19 by sliding, and the upper guide portion 4 defining and functioning as the guide portion that is provided in the case body and guides the sliding of the shutter 30. The upper guide portion 4 includes the main path 40 in which the distal end portion defining and functioning as one end portion of the shutter 30 is provided when the shutter 30 opens the discharge port 19, and the first branch path 41 and the second branch path 42 that each branch from the end portion of the main path 40 and to each of which the distal end portion 30a of the shutter 30 is selectively insertable when the shutter 30 closes the discharge port 19. The pin 50 defining and functioning as the regulator is detachably attached to the case body 10 such that the distal end portion 30a of the shutter 30 is selectively inserted to either one of the first branch path 41 and the second branch path 42. In a case in which the shutter 30 slides to close the discharge port 19 from the state in which the discharge port 19 is open, while the pin 50 is attached to the case body 10, the distal end portion 30a of the shutter 30 is inserted into the first branch path 41, and while the pin 50 is not attached to the case body 10, the distal end portion 30a of the shutter 30 is inserted into the second branch path 42. It can be visually recognized from outside that the distal end portion 30a of the shutter 30 is inserted into either one of the first branch path 41 and the second branch path 42.

With such a configuration, by defining opening and closing of the shutter 30 by the device in a state in which the pin 50 is mounted as a normal handling method, it is possible to visually recognize whether or not the distal end portion 30a of the shutter 30 has been inserted into the second branch path 42 and determine whether or not the case 1 has been opened by a person.

As a result, it is possible to recognize the possibility of mixing of components into the case 1.

(2) In a case 1 according to a preferred embodiment, the case body 10 includes the through hole 43 to which the pin

50 is detachably attached, and while the pin 50 is attached to the through hole 43, the distal end portion 30a of the shutter 30 is inserted into the first branch path 41, and while the pin 50 is not attached to the through hole 43, the distal end portion 30a of the shutter 30 is inserted into the second branch path 42.

With such a configuration, it is possible to attach the pin 50 to the case body 10 accurately and easily.

(3) In a case 1 according to a preferred embodiment, it is preferable that, while the pin 50 is attached to the case body the pin 50 closes the entrance of the second branch path 42 and is contactable with the distal end portion 30a of the shutter and when the distal end portion 30a of the shutter 30 is brought into contact with the pin 50, the pin 50 allows the distal end portion 30a of the shutter 30 to be inserted into the first branch path 41.

With such a configuration, it is possible to enable the distal end portion 30a of the shutter 30 to be securely inserted into the first branch path 41, and thus, it is possible to reduce or prevent the occurrence of erroneous insertion into the second branch path 42.

(4) In a case 1 according to a preferred embodiment, it is preferable that the case body 10 includes at least a transparent or semitransparent portion corresponding to the first branch path 41 and the second branch path 42.

With such a configuration, it is possible to visually recognize from the outside easily and securely that the distal end portion 30a of the shutter 30 is inserted into either one of the first branch path 41 and the second branch path 42.

(5) In a case 1 according to a preferred embodiment, it is preferable that, instead of the pin 50, a special pin or a special screw to be attached to the case body 10 using a special tool is used.

With such a configuration, for example, it is possible to avoid a person other than the permitted person to slide the shutter 30 to open the discharge port 19, and thus, it is possible to prevent mixing of components into the case 1.

(6) In a case 1 according to a preferred embodiment, it is preferable that the case body 10 includes the sloped surface 17a that is sloped at a downward gradient toward the discharge port 19 in the state in which the case body 10 is set to the feeder 100 and enables the electronic components M housed in the housing space 11 to be transported the discharge port 19.

With such a configuration, it is possible to enable the electronic components M to smoothly and reliably be transported to the discharge port 19 in the case body 10.

(7) In a case 1 according to a preferred embodiment, it is preferable that the sloped surface 17a is sloped at about 3° or more and about 10° or less in the state in which the case body 10 is set to the feeder 100.

With such a configuration, it is possible to enable the electronic components M to smoothly and reliably be transported to the discharge port 19 while the electronic components M move down the sloped surface 17a and are transported in the case 1.

Although preferred embodiments of the present invention have been described above, the present invention is not limited to the preferred embodiments, and modifications, improvements, and the like within the scope of the present invention are included in the present invention.

For example, the entire case body 10 including the first member 2 and the second member 3 need not be transparent or semi-transparent, and at least a portion corresponding to the first branch path 41 and the second branch path 42 may be transparent or semi-transparent which can be visually recognized from the outside.

Furthermore, the through hole may be provided in a portion corresponding to each of the first branch path 41 and the second branch path 42, and it may be possible to visually recognize that the distal end portion 30*a* of the shutter 30 is inserted into one of the first branch path 41 and the second branch path 42 through the through hole.

Any sliding path of the shutter 30 which opens and closes the discharge port 19 is acceptable, and along with this, any shape of the first branch path 41 and the second branch path 42 of the guide portion 4, any position of the first branch path 41 and the second branch path 42, etc., are also acceptable, and thus, the shape, the position, etc., are not limited to the above-described preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A case comprising:

a case body to house a plurality of components and including a discharge port to discharge housed components;

a shutter to open and close the discharge port by sliding; and a guide portion in the case body to guide the sliding of the shutter; wherein the guide portion includes:

a main path in which one end portion of the shutter is located when the shutter opens the discharge port; and a first branch path and a second branch path each branching from an end portion of the main path and to each of which the one end portion of the shutter is selectively insertable when the shutter closes the discharge port;

a regulator is detachably attached to the case body such that the one end portion of the shutter is selectively inserted in either one of the first branch path and the second branch path;

when the shutter slides to close the discharge port from a state in which the discharge port is open, while the regulator is attached to the case body, the one end portion of the shutter is inserted into the first branch path, and while the regulator is not attached to the case body, the one end portion of the shutter is inserted into the second branch path; and the one end portion of the shutter is visually recognizable from outside.

2. The case according to claim 1, wherein the case body includes a through hole to which the regulator is detachably attached; and while the regulator is attached to the through hole, the one end portion of the shutter is inserted into the first branch path, and while the regulator is not attached to the through hole, the one end portion of the shutter is inserted into the second branch path.

3. The case according to claim 1, wherein, while the regulator is attached to the case body, the regulator closes an entrance of the second branch path and is contactable with the one end portion of the shutter, and when the one end portion of the shutter is brought into contact with the regulator, the regulator guides the one end portion of the shutter to be inserted into the first branch path.

4. The case according to claim 1, wherein the case body includes at least a transparent or semi-transparent portion corresponding to the first branch path and the second branch path.

5. The case according to claim 1, wherein the regulator includes a pin or a screw attachable to the case body via a tool.

6. The case according to claim 1, wherein the case body includes a sloped surface with a downward gradient sloped toward the discharge port to enable the components housed in a housing space to be transported to the discharge port.

7. The case according to claim 6, wherein the sloped surface is sloped at about 3° or more and about 10° or less in the predetermined set state.

8. The case according to claim 1, wherein each of the plurality of components a rectangular or substantially rectangular parallelepiped electronic component having a length of about 1.2 mm or less.

9. The case according to claim 1, wherein each of the plurality of components is a capacitor or an inductor.

10. The case according to claim 1, wherein the discharge port includes a rectangular or substantially rectangular opening.

11. The case according to claim 1, wherein the shutter includes an elongated strip-shaped film.

12. The case according to claim 1, wherein the shutter is made of polyethylene terephthalate.

13. The case according to claim 1, wherein a width of the shutter is larger than a width of the discharge port.

14. The case according to claim 1, wherein the shutter includes an opening a same or substantially a same shape as a shape of the discharge port.

15. The case according to claim 1, wherein a slider is provided at a rear end of the shutter.

16. The case according to claim 15, wherein the slider includes a knob protruding downward.

17. The case according to claim 16, wherein the knob includes an elliptical or substantially elliptical protrusion.

* * * * *